(12) United States Patent
Weale

(10) Patent No.: US 11,916,619 B2
(45) Date of Patent: Feb. 27, 2024

(54) AUTO-TUNER FOR RESONANT CIRCUIT

(71) Applicant: SEMICONDUCTOR COMPONENTS INDUSTRIES, LLC, Phoenix, AZ (US)

(72) Inventor: Gareth Pryce Weale, New Hamburg (CA)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 0 days.

(21) Appl. No.: 17/650,610

(22) Filed: Feb. 10, 2022

(65) Prior Publication Data
US 2023/0254014 A1 Aug. 10, 2023

(51) Int. Cl.
*H04B 5/00* (2006.01)
*G06K 19/07* (2006.01)
*H04B 5/02* (2006.01)

(52) U.S. Cl.
CPC ........ *H04B 5/0081* (2013.01); *G06K 19/0723* (2013.01); *H04B 5/0031* (2013.01); *H04B 5/02* (2013.01); *H03J 2200/06* (2013.01)

(58) Field of Classification Search
CPC ...... H04B 5/0081; H04B 5/0031; H04B 5/02; G06K 19/0723; H03J 2200/06
USPC ........................................................ 455/41.1
See application file for complete search history.

(56) References Cited

U.S. PATENT DOCUMENTS

| | | | |
|---|---|---|---|
| 9,685,996 B1 | 6/2017 | Theon | |
| 10,050,677 B1 | 8/2018 | Thoen | |
| 10,277,284 B1 | 4/2019 | Kerselaers | |
| 2014/0225450 A1* | 8/2014 | Endo | H01F 38/14 307/104 |
| 2014/0241556 A1 | 8/2014 | Larsen et al. | |
| 2016/0141883 A1* | 5/2016 | Kanno | H02J 50/10 307/104 |
| 2016/0329638 A1* | 11/2016 | Kanno | H04B 5/0062 |

FOREIGN PATENT DOCUMENTS

EP 3261262 A1 12/2017

OTHER PUBLICATIONS

Extended European Search Report dated Jun. 23, 2023 for counterpart European Patent Application No. 22212798.7, 8 pages.

* cited by examiner

*Primary Examiner* — Eugene Yun
(74) *Attorney, Agent, or Firm* — Brake Hughes Bellermann LLP

(57) ABSTRACT

A tuning circuit for a near-field magnetic induction (NFMI) system suitable for near field communication (NFC) is disclosed. The NFMI system includes a tuning circuit that is configured to measure a phase across a series capacitor coupled between a resonant circuit and a transmit circuit in order to determine a resonant condition of the resonant circuit. When the resonant condition is above resonance or below resonance, the tuning circuit can tune an adjustable capacitor of the resonant circuit. The tuning can continue until the phase measurement indicates that the resonant circuit is at resonance. The phase-based tuning allows for the tuning to operate continuously and concurrently with NFC.

23 Claims, 8 Drawing Sheets

AUTO-TUNER FOR RESONANT CIRCUIT

FIELD OF THE DISCLOSURE

The present disclosure relates to electromagnetic communication systems and more specifically to an auto-tuner for an inductive element to facilitate near field communication (NFC).

BACKGROUND

Near field communication (NFC) is a short-range wireless communication technology that can be used for a variety of applications including mobile payment, authentication, data exchange, and ticketing. NFC can utilize near field magnetic induction (NFMI) as a means for transmitting/receiving information wirelessly. The range of such communication is short range because a transmitter and receiver communicate through inductive coupling through a magnetic field. The short-range of the inductive coupling can provide security because only a receiver in a near field of the transmitter may receive the communication. The near field may be determined based on the frequency of operation. For example, when the frequency of operation is 13.56 megahertz (MHz), a near field may extend only 3.5 meters. Although NFC technologies may have some communication advantages in some applications, known NFC technologies, however, may have deficiencies in other applications.

SUMMARY

In at least one aspect, the present disclosure generally describes a system. The system includes a transmit circuit that is configured to transmit a transmit signal and an antenna circuit configured to generate a magnetic field based on the transmit signal. The antenna circuit includes a resonant circuit with a coil and an adjustable capacitor. The antenna circuit further includes a coupling capacitor that is connected between the resonant circuit and the transmit circuit. The system further includes a tuning circuit that is configured to measure a phase across the coupling capacitor to determine a resonant conation of the resonant circuit and to tune the adjustable capacitor according to the resonant condition.

In a possible implementation of the system, the transmit signal is transmitted at an operating frequency, the resonant circuit resonates at a resonant frequency, and the resonant condition is determined as a difference between the operating frequency and the resonant frequency.

In another aspect, the present disclosure generally describes a method for tuning a resonant circuit. The method includes measuring a phase shift across a series capacitor coupled to an input of the resonant circuit, comparing the phase shift to a resonant phase shift, and adjusting a tuning level according to the comparison. The method further includes tuning an adjustable capacitor in the resonant circuit based on the adjusted tuning level and repeating the tuning process (i.e., the measuring, the comparing, the adjusting, and the tuning).

In another aspect, the present disclosure generally describes an NFC transceiver. The NFC transceiver includes a source coupled to a positive input of a coil via a positive coupling capacitor and also coupled to a negative input of a coil via a negative coupling capacitor. The NFC transceiver further includes an adjustable capacitor coupled in a parallel connection with the coil. The NFC transceiver further includes a tuning circuit configured to tune the adjustable capacitor based on a phase of the positive coupling capacitor or the negative coupling capacitor relative to the source so that the coil resonates at a frequency of the source.

The foregoing illustrative summary, as well as other exemplary objectives and/or advantages of the disclosure, and the manner in which the same are accomplished, are further explained within the following detailed description and its accompanying drawings.

BRIEF DESCRIPTION OF THE DRAWINGS

The components in the drawings are not necessarily to scale relative to each other. Like reference numerals designate corresponding parts throughout the several views.

DETAILED DESCRIPTION

The present disclosure describes an automatic tuner configured to cause an antenna circuit of an NFC transceiver to resonate in order increase (e.g., maximize) its coupling efficiency in an NFC system. The disclosed approach can provide continuous and autonomous tuning of an antenna circuit. The circuitry of the disclosed approach can be relatively simple and can consume little power when compared with other approaches. For example, the disclosed approach does not require sensing a signal strength of a received signal in a separate tuning process. By avoiding the separate tuning process, the near-field communication is not interrupted, and no additional circuitry is required to perform the separate tuning process in parallel with the near-field communication. Further, the disclosed approach does not require mapping a frequency response in order to determine a direction of the tuning. One possible technical effect of the disclosed approach is the extension of a battery life of an NFC transceiver due to its more efficient coupling and lower power requirements for tuning.

Figure 1:
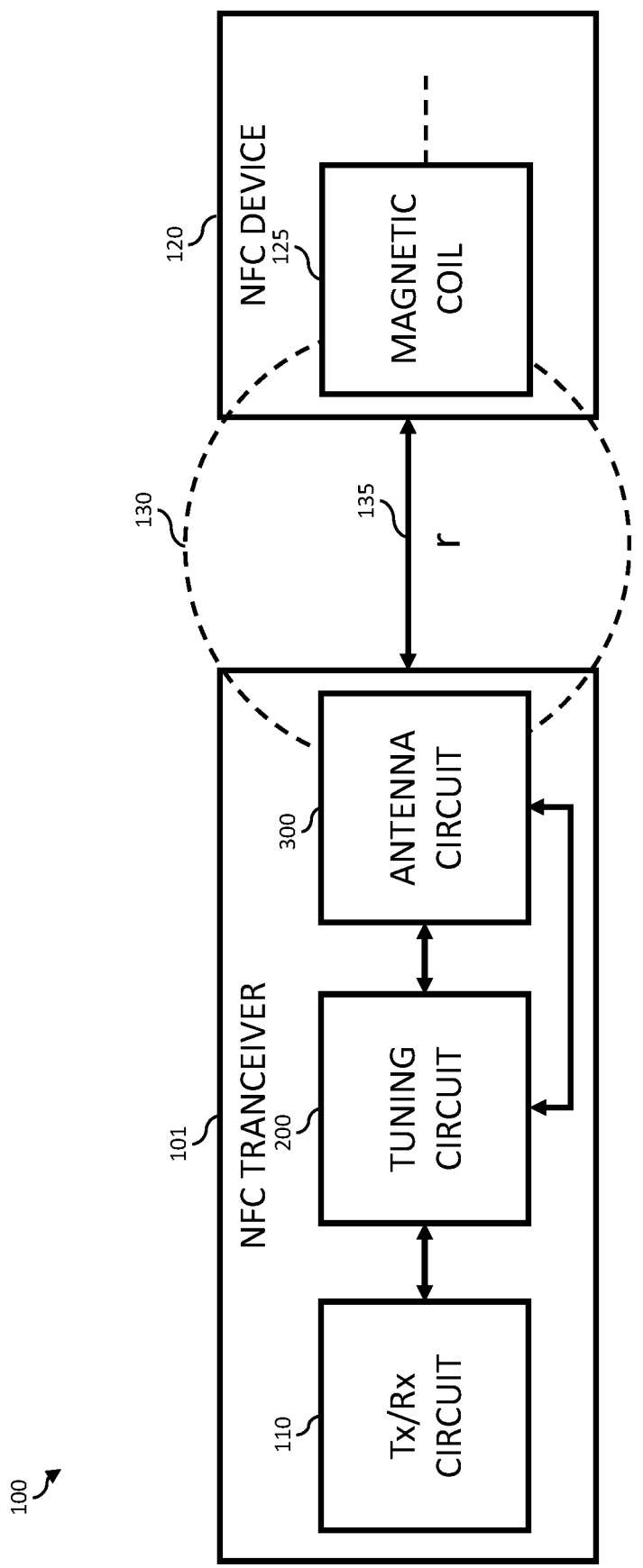
FIG. 1 is a block diagram of an NFC system according to a possible implementation of the present disclosure.

FIG. 1 illustrates an NFC system according to an implementation of the present disclosure. The NFC system 100 includes an NFC transceiver 101 that is configured to transmit and/or receive information to/from another NFC device 120 through a magnetic field 130. The NFC system 100 can include a transmit/receive circuit (i.e., Tx/Rx circuit 110) and an antenna circuit 300. To transmit information to another NFC device 120, a Tx circuit of the Tx/Rx circuit 110 can be configured to transmit an amplified and modulated transmit signal corresponding to the information for transmission to the antenna circuit 300. The antenna circuit is configured by the transmit signal to generate a magnetic field 130, which can be inductively coupled to a magnetic coil 125 of the other NFC device 120. To receive information from the other NFC device 120, an Rx circuit of the Tx/Rx circuit 110 can be configured to receive (i.e., amplify, demodulate) a receive signal from the antenna circuit 300. The receive signal from the antenna circuit can be generated by a magnetic field generated by the magnetic coil 125 of the other NFC device 120.

The inductive coupling between the NFC transceiver 101 and the other NFC device 120 can be depend on an amplitude (i.e., strength) of the magnetic field 130 and a spatial separation (i.e., range 135) between the NFC transceiver 101 and the other NFC device 120. The range can significantly affect the inductive coupling. For example, the coupling may decrease at a rate of that is the inverse of the range (r) raised to the sixth power (i.e., $r^{-6}$). In other words, the coupling may decrease 60 dB/decade as the range is increased. Thus, a practical range for near field magnetic induction (NFMI) may be limited to a few meters (e.g., 3 meters) for a frequency (e.g., 13.56 MHz) in a band of the spectrum designated for NFC. Maintaining the magnetic field 130 at a high amplitude may help to prevent these range losses from making the communication impractical.

The antenna circuit 300 may include an inductive element (i.e., magnetic coil, coil) to convert a transmit signal (e.g., current pulses) into a magnetic field according to the equation below.

$$B = \frac{\mu_o n I}{2R} \quad (1)$$

In the equation above the magnetic field strength (B) is proportional to the current (I) in the coil, where n is the number of turns of the coil and R is the radius of the coil. The field strength is maximized with the current in the coil is maximized. The current in the coil can be maximized by resonating the coil with a capacitive element. In other words, the coil current may be at a maximum in a resonance condition.

Figure 2:
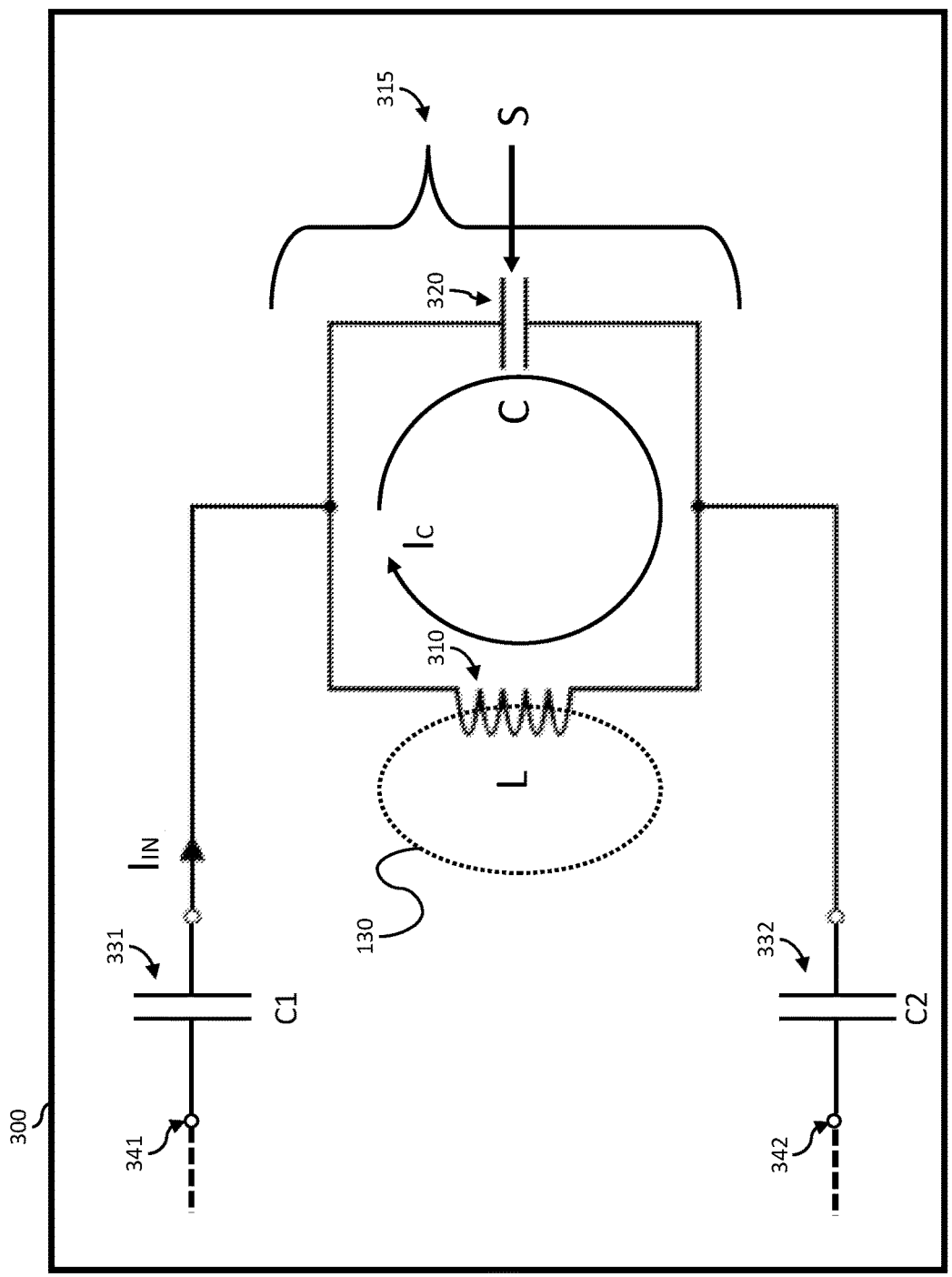
FIG. 2 is a schematic of an antenna circuit according to a possible implementation of the present disclosure.

FIG. 2 schematically illustrates an antenna circuit according to a possible implementation of the present disclosure. The antenna circuit 300 includes an inductive element (e.g., coil 310) having an inductance (L). The antenna circuit 300 further includes a capacitive element (e.g., capacitor 320) having a capacitance (C). The coil 310 and the capacitor 320 can be connected in parallel to form a resonant circuit. An impedance of the resonant circuit can be maximized (e.g., ideally infinite) by exciting the resonant circuit at a resonant frequency ($\omega_o^2=1/LC$). Accordingly, at the resonance frequency (i.e., at resonance), no input current ($I_{IN}$) flows into the resonant circuit 315, but instead a circulating current ($I_C$) in the resonant circuit is circulates between the capacitor 320 and the coil 310 as energy is exchanged. At resonance, the circulating current undergoes a 360-degree phase shift each time it circulates. Because the reactance of the capacitor 320 and the coil 310 match at resonance, half of this phase shift (i.e., 180 degrees) is imparted by the capacitor 320 and the other half of the phase shift (i.e., 180 degrees) is imparted by the coil 310. The circulating current ($I_c$) is maximized at resonance and creates the magnetic field 130 used for NFC. Accordingly, NFC may be improved (e.g., extended range, lower bit error rate, etc.) when the resonant circuit 315 is tuned to resonance.

This preceding description assumes ideal conditions. In practice, the resonant circuit 315 can be altered by its environment. For example, the capacitance (C) and the inductance (L) of the resonant circuit may interact (e.g., combine) with parasitic capacitances and inductances so that the effective impedance of the resonant circuit resonates at an undesirable frequency. To compensate for these unknown and changing conditions, the capacitance (C) of the capacitor 320 may be adjusted (i.e., tuned) in order to shift the resonance to a desirable frequency.

Returning to FIG. 1, the NFC system further includes a tuning circuit that is configured to adjust the capacitance (C) so that a coupling efficiency between the antenna circuit 300 and the magnetic field 130 is increased (e.g., maximized) at the operating frequency (e.g., 13.56 MHz) of the NFC transceiver 101. The tuning circuit 200 is configured to sense a resonant condition of the antenna circuit 300. Based on the resonant condition, the tuning circuit 200 is further configured to adjust (e.g., increase, decrease) the capacitance of the resonant circuit 315. The disclosed tuning circuit can sense the resonant condition continuously and in real-time. As a result, the NFC transceiver 101 is not required to pause communication to sense the resonant condition. Further, the tuning circuit 200 senses the resonant condition using a phase condition of the antenna circuit 300 and not an amplitude condition of the antenna circuit 300. For example, the tuning circuit 200 does not sense resonance by measuring a voltage of the resonant circuit 315. Further, the tuning circuit 200 does not rely on a reflection measurement to sense resonance that could require directional couplers or the like, which are difficult to construct at operating conditions (e.g., 13.56 MHz) typically associated with NFC (e.g., see ISO/IEC 1892:2013).

Returning to FIG. 2, the coil 310 of the antenna circuit 300 can be an inductive loop having a one or more turns. The one or more turns may be arranged in a planar or a non-planar configuring. The capacitor 320 of the antenna circuit may have capacitance (C) that is adjustable (i.e., tunable) via a signal (S). In other words, the capacitor 320 may be an adjustable capacitor (i.e., tunable capacitor). In a possible implementation, the capacitor 320 is a digitally tuned capacitor that includes a plurality of capacitors (i.e., capacitor bank) coupled in parallel between an input terminal and an output terminal that can be switched in/out of the capacitor bank based on a signal (e.g., n-bit digital signal) to adjust the capacitance.

The antenna circuit 300 further includes a positive coupling capacitor 331 (i.e., C1) coupled (e.g., directly coupled) between the resonant circuit 315 and a positive input 341. The antenna circuit 300 also includes a negative coupling capacitor 332 (i.e., C2) coupled (e.g., directly coupled) between the resonant circuit 315 and a negative input 342 (i.e., IN−). The positive coupling capacitor 331 and the negative coupling capacitor 332 (i.e., the series capacitors) are configured to decouple (i.e., filter, DC block, etc.) the resonant circuit 315 from the Tx/Rx circuit 110 (e.g., power amplifier). For example, the coupling capacitors can block direct current (DC) from a driver of the Tx/Rx circuit 110. The positive input 341 and the negative input 342 form a differential input. The positive coupling capacitor 331 and the negative coupling capacitor 332 can have approximately (e.g., within 1%) the same capacitance (i.e., matched) for the differential input to have approximately the same current flowing into the positive input as flows out of the negative input (i.e., balanced input).

Figure 3:
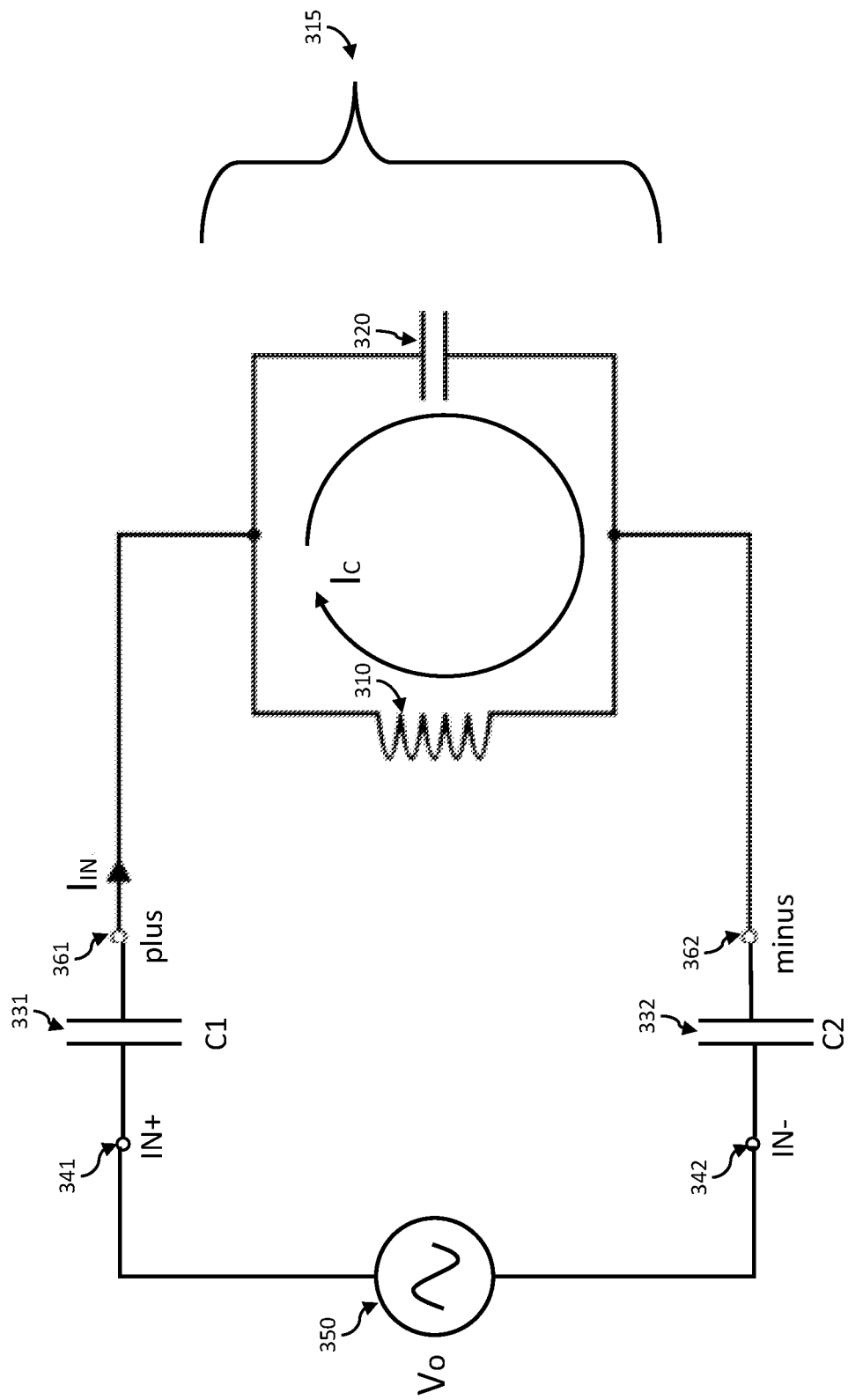
FIG. 3 is a schematic of an antenna circuit coupled to a source according to a possible implementation of the present disclosure.

FIG. 3 illustrates the antenna circuit coupled to a source 350. The source 350 is configured to apply an oscillating voltage (Vo) between the positive input 341 (i.e., IN+) and the negative input 342 (i.e., IN−). The oscillating voltage oscillates at an operating frequency (i.e., Fo). The resonant circuit 315 resonates at a resonant frequency (i.e., Fr). It may be desirable from NFC standpoint (e.g., to maximize range) for the operating frequency to equal the resonance frequency; however this is not always the case. The operating frequency (i.e., Fo) of the source can remain fixed while the resonant frequency of the resonant circuit changes. For example, a parasitic capacitance/inductance from an environment may change the resonant frequency of the resonant circuit so the resonant frequency does not equal the operating frequency. Alternatively, the resonant frequency of the resonant circuit can remain fixed while the operating frequency of the source may change. For example, a thermal change to the source can change the operating frequency so that the operating frequency does not equal the resonant frequency.

A resonant condition of the resonant circuit is defined by the relationship between the resonant frequency and the operating frequency. In other words, the source transmits a signal at an operating frequency (Fo), the resonant circuit resonates at a resonant frequency (Fr), and the resonant condition can be based on a difference between the operating frequency and the resonant frequency (e.g., Fo−Fr). The resonant condition can be (i) below resonance when the operating frequency is less than the resonant frequency (i.e., $F_o < F_r$), (ii) at resonance when the operating frequency equals the resonant frequency (i.e., $F_r = F_o$), and (iii) above resonance when the operating frequency is larger than the resonant frequency (i.e., $F_r > F_o$).

Figure 4:
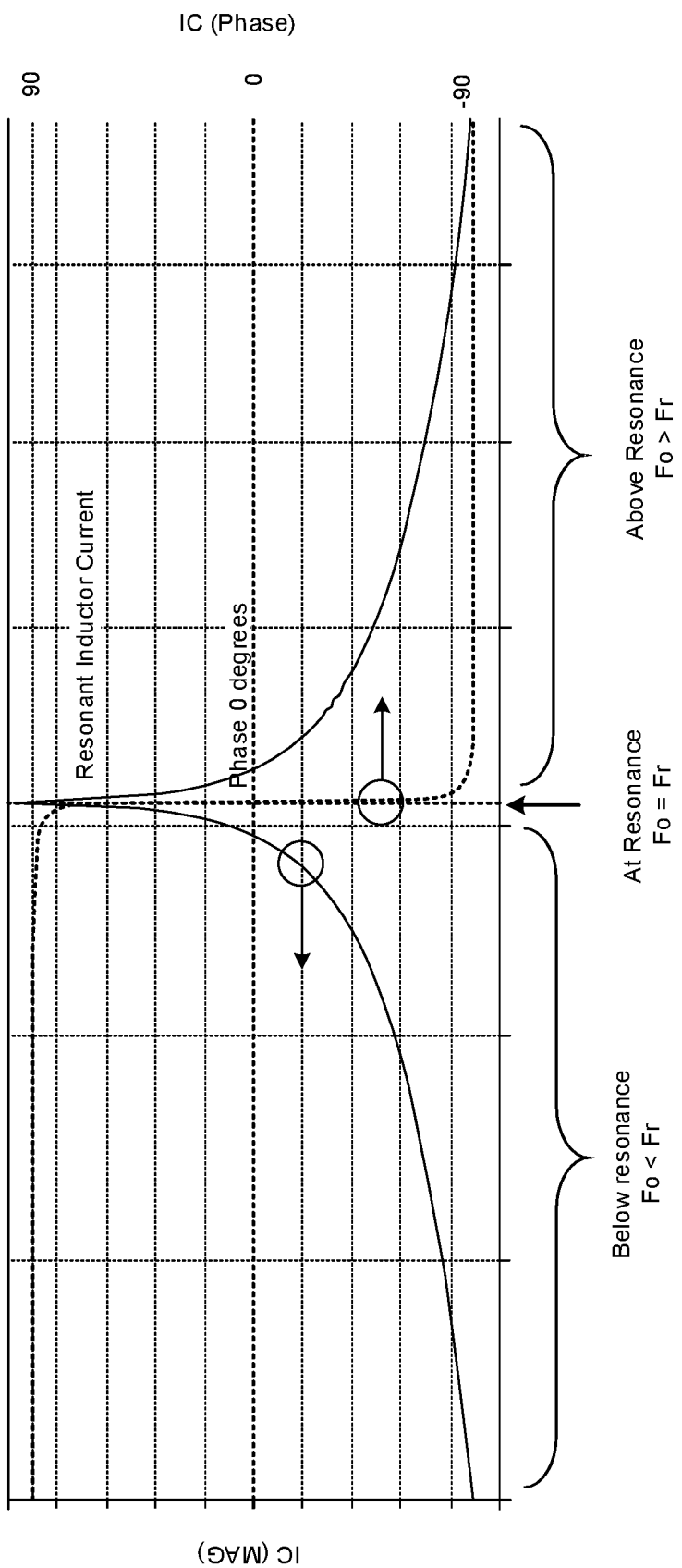
FIG. 4 is a graph that plots the magnitude and phase of the coil current of FIG. 3 over a range of frequencies of the source according to a possible implementation of the present disclosure.

FIG. 4 illustrates the coil current (Ic) for the resonant conditions (i.e., below resonance, at resonance, above resonance) described earlier. As shown, the coil current (Ic) amplitude is maximum at resonance (i.e., Fr=Fo) but quickly drops in magnitude as a mismatch between the operating frequency and the resonant frequency (i.e., Fo−Fr) increases. Additionally, the phase of the coil current changes (e.g., between +90 and −90 degrees) depending on the direction of the mismatch (i.e., above resonance or below resonance).

Tuning the resonant circuit to resonance can require sensing the amplitude to determine how much the capacitor should be tuned and sensing the phase to determine whether the capacitance should be increased or decreased. Sensing the resonant condition based on the coil current (Ic) poses technical problems. For example, it may be necessary to interrupt communication to measure the inductor current (Ic) for a range of frequencies, as shown in FIG. 4. Further, performing an analysis of the measured inductor current and measured inductor phase to determine the necessary tuning may add complexity. The interruptions may and the added complexity may be impractical for NFC communication applications. The disclosed approach solves these technical problems by measuring another parameter of the antenna circuit 300 that is indicative of the resonant condition of the resonant circuit. This measurement can be performed concurrently with communication (i.e., no interruption) and can determine how much and in what direction the capacitor should be tuned with only one measurement (i.e., reduced complexity).

Returning to FIG. 3, the positive coupling capacitor 331 (C1) (i.e., first series capacitor) is coupled to the source 350 (Vo) at the positive input 341 (IN+). The positive coupling capacitor 331 (C1) is also coupled to the resonant circuit 315 at a plus node 361 (i.e., plus) of the resonant circuit. The negative coupling capacitor 332 (C2) (i.e., second series capacitor) is coupled to the source 350 at the negative input 342 (i.e., IN−). The negative coupling capacitor 332 (C2) is also coupled to the resonant circuit 315 at a minus node 362 (i.e., minus) of the resonant circuit. A phase of a voltage (i.e., V(plus)) at the plus node 361 (i.e., plus) relative to a phase of a voltage (i.e., Vo) of the source 350 changes according to the resonant state of the resonant circuit. Likewise, a phase of a voltage (i.e., V(minus)) at the minus node 362 (i.e., minus) relative to a phase of a voltage (i.e., Vo) of the source 350 changes according to the resonant state (i.e., below resonance, at resonance, above resonance) of the resonant circuit.

Figure 5:
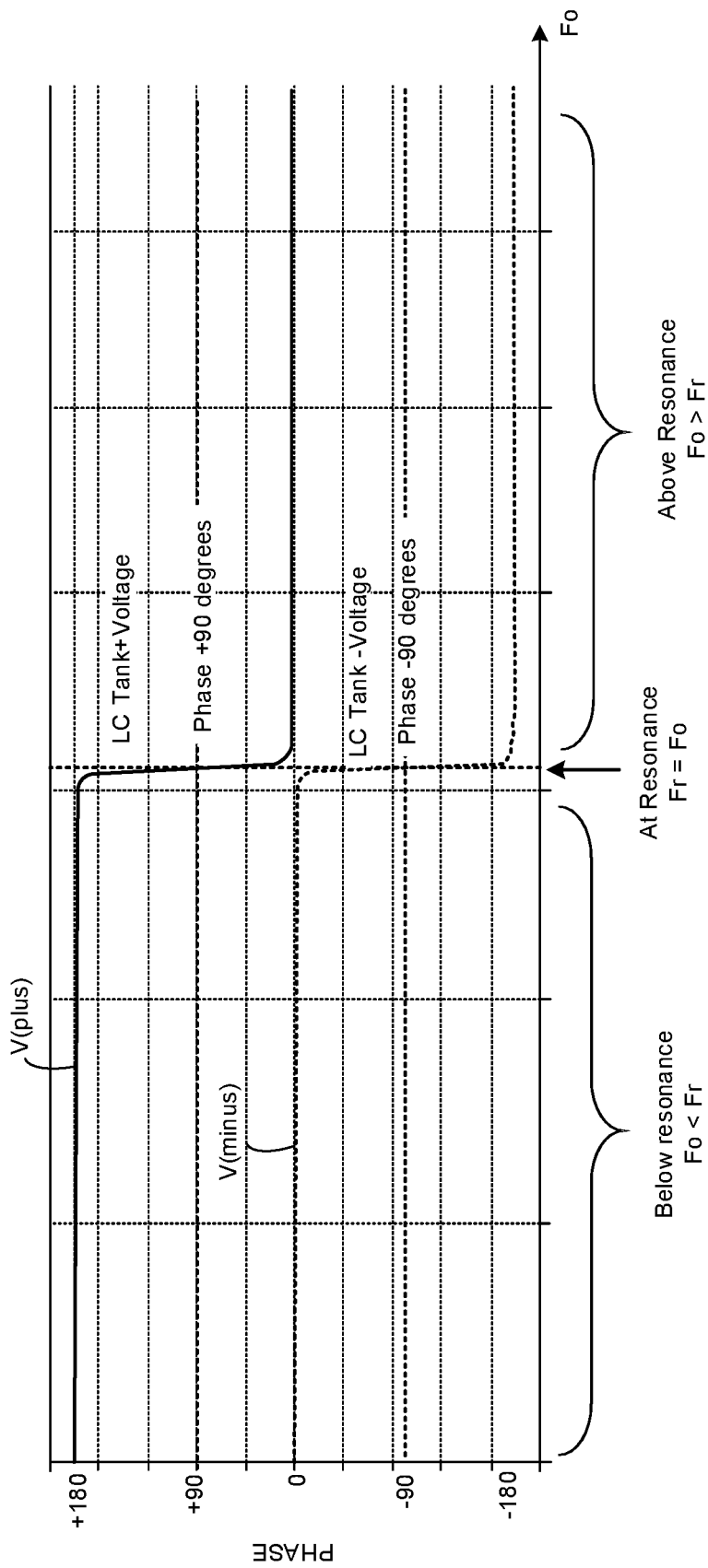
FIG. 5 is a graph that plots phases of the coupling capacitors of FIG. 3 over a range of frequencies of the source according to a possible implementation of the present disclosure.

FIG. 5 illustrates a phase of a plus voltage (V(plus)) at the plus node 361 and a phase of a minus voltage (V(minus)) at the minus node 362 of the antenna circuit of FIG. 3. The phases are plotted for various resonant conditions. In each resonant condition, the phase difference between the plus voltage (V(plus)) and the minus voltage (V(minus)) is 180 degrees. At resonance (i.e., Fr=Fo) the voltage at each node experiences a phase shift (i.e., phase transition).

Below resonance (i.e., Fo<Fr), the phase of the plus voltage at the plus node 361 (i.e., plus) is +180 degrees relative to the source voltage at the positive input 341 (i.e., IN+). Above resonance (i.e., Fo>Fr), the phase of the plus voltage at the plus node 361 is 0 degrees relative to the source voltage at the positive input 341. A resonance (i.e., Fo=Fr), the phase of the plus voltage at the plus node 361 is +90 degrees relative to the source voltage at the positive input 341. In other words, at resonance the phase shift is halfway between the below resonance state and the above resonance state.

Below resonance (i.e., Fo<Fr), the phase of the minus voltage at the minus node 362 (i.e., minus) is 0 degrees relative to the source voltage at the negative input 342 (i.e., IN−). Above resonance (i.e., Fo>Fr), the phase of the minus voltage at the minus node 362 is −180 degrees relative to the source voltage at the negative input 342. A resonance (i.e., Fo=Fr), the phase of the minus voltage at the minus node 362 is −90 degrees relative to the source voltage at the positive input 341. In other words, at resonance the phase shift is halfway between the below resonance state and the above resonance state. Table 1 illustrates the phase relationships of the antenna circuit in the resonant conditions.

TABLE 1

Example Phase Relationships of Antenna Circuit in Resonant Conditions

| RESONANT CONDTION | V(plus) | V(minus) |
|---|---|---|
| BELOW (Fo < Fr) | +180 | 0 |
| AT (Fo = Fr) | +90 | −90 |
| ABOVE (Fo > Fr) | 0 | −180 |

The phase of the voltage at the plus node 361 relative to the voltage at the positive input 341 may be measured to determine when the resonant circuit is at resonance. Further, when the resonance circuit is not at resonance, the phase measurement indicates which direction to tune to reach resonance. Likewise, the phase of the voltage at the minus node 362 relative to the voltage at the negative input 342 may be measured to determine when the resonant circuit is at resonance and in what direction to tune. Because the capacitors are matched (e.g., have capacitances with 1%), either the plus node 361 or the minus node 362 may be used for a tuning.

A tuning circuit 200 can be configured to monitor a phase shift on one of the coupling capacitors and generate a tuning signal based on the phase shift. The phase shift may be monitored continuously so that a change in the resonant condition can be met with a corresponding change in the tuning signal. The tuning signal may be coupled to the capacitor 320 of the resonant circuit in order to change (i.e., tune) its capacitance. In other words, the tuning circuit can respond to a change in the resonant condition by tuning the capacitance of the resonant circuit so that a resonance can be maintained. The phase monitoring may be continuous in order to automatically tune in response to changing conditions. Alternatively, the phase monitoring can be periodic or triggered (i.e., as needed). For example, the tuning circuit may be configured to hold the tuning signal (e.g., in a latched state) based on a phase measurement taken at a first time and then not monitor the phase again until triggered at a later second time. This approach may be useful in low power applications (e.g., medical applications, hearing aids, etc.) in which shutting down all, or a portion, of the tuning circuit 200 can conserve power. Additionally, because the tuning circuit measures a phase it is independent of frequency and can be applied to various frequencies without change. For example, the tuning circuit may be used to tune resonant circuits designed for 3.3 MHz, 13.56 MHz, or 22 MHz, which are frequencies used in NFC communication.

Figure 6:
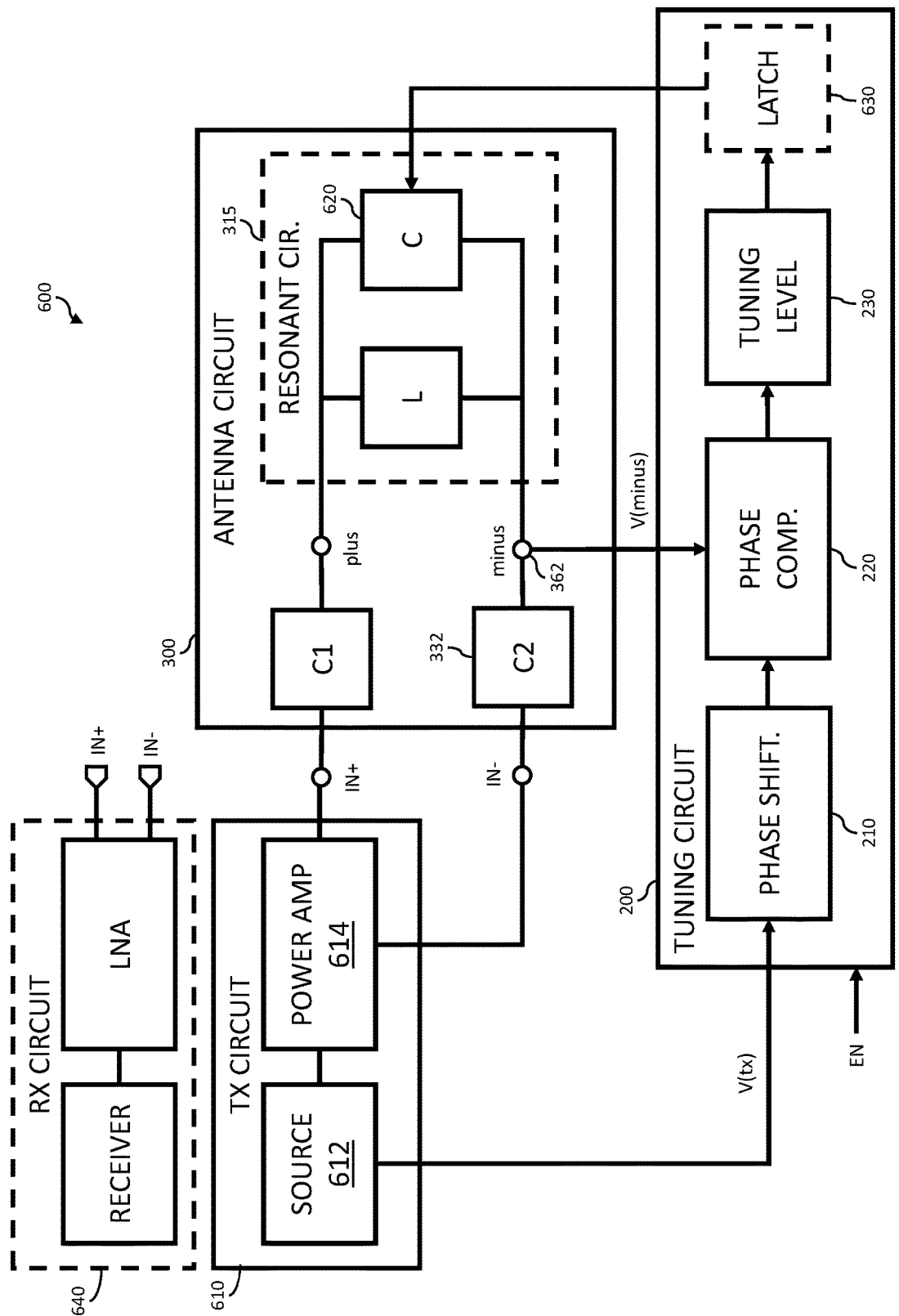
FIG. 6 is a block diagram of nearfield magnetic induction (NFMI) system according to a possible implementation of the present disclosure.

FIG. 6 illustrates a near-field magnetic induction (NFMI) system according to a possible implementation of the present disclosure. The system 600 includes a transmit circuit 610 (i.e., TX circuit). The transmit circuit 610 includes a source that is configured to transmit a signal (e.g., modulated signal) at an operating frequency (Fo). The transmit circuit 610 can further include a power amplifier 614 that is configured to amplify the signal from the source and transmit it to a differential input (IN+, IN−) of an antenna circuit 300.

The antenna circuit 300 includes coupling capacitors (C1, C2) at the differential input (IN+, IN−) in order to decouple a resonant circuit 315 from the power amplifier 614. The resonant circuit 315 can resonate at a resonant frequency (Fr) based on an inductance (L) and a capacitance (C), such as shown in the equation below.

$$F_r = \frac{1}{2\pi\sqrt{LC}} \quad (2)$$

The inductance (L) of the resonant circuit 315 can be implemented as a coil that is configured to generate a magnetic field corresponding to the transmitted signal. The magnetic field can be used to communicate the transmitted signal wirelessly via NFMI to another device. The capacitance (C) of the resonant circuit can be a tunable capacitor 620. For example, the tunable capacitor 620 may be implemented as a bank of switched capacitors that are controlled by bit levels of a digital signal received at the tunable capacitor from a tuning circuit 200. The resonant circuit can be tuned to resonance (i.e., Fr=Fo) by adjusting the capacitance (C) of the tunable capacitor 620.

The system 600 further includes a tuning circuit 200 that is coupled between the source 612 of the transmit circuit 610 and the tunable capacitor 620 of the resonant circuit 315. Additionally, the tuning circuit is coupled to either coupling capacitor (C1, C2) at the input to the resonant circuit. As shown, the tuning circuit 200 is coupled the negative coupling capacitor 332 (C2) at the minus node 362 (i.e., minus) between negative coupling capacitor 332 and the resonant circuit 315.

The tuning circuit 200 can include a phase shifter 210. The phase shifter 210 is configured to shift the phase of the transmit voltage (i.e., V(tx)) by −90 degrees because the phase of the voltage at the minus node 362 (i.e., V(minus)) relative to the transmit voltage can be −90 degrees at resonance (see FIG. 5). The phase shifter 210 may be implemented using analog or digital phase shifting circuitry.

The tuning circuit 200 can further include a phase comparator 220. The phase comparator 220 is configured to receive the phase shifted transmit signal and the minus signal. The phase comparator 220 is further configured to measure a phase difference ($\Delta\phi$) between the signals. At resonance, the phase difference is approximately equal to zero (e.g., $\Delta\phi=0\pm1$ degrees). In a possible implementation, the measurement of the phase difference is simply an indication of whether the phase difference corresponds to a below resonance condition or an above resonance condition. For example, when the voltage at the minus node is used, the below resonance condition may correspond to a positive phase difference (e.g., $\Delta\phi>0$), while the above resonance condition my correspond to a negative phase difference (e.g., $\Delta\phi<0$). The phase comparator may be configured to output a three-level signal based on the state of the phase condition. For example, the phase comparator may output a positive signal level (e.g., +1) when the above resonance condition is measured, a negative level (e.g., −1) when the below resonance condition is measured, and a zero level (e.g., 0) when the resonance condition is measured.

The tuning circuit can further include a tuning level circuit 230. Based on the output of the comparator the tuning level circuit may be configured to tune up, tune down, or hold the capacitor of the tunable capacitor. For example, when the resonant frequency is above the operating frequency (i.e., below resonance condition) the tuning level circuit 230 may be triggered to increase the capacitance (C) of the tunable capacitor to lower the resonant frequency. When the resonant frequency is below the operating frequency (i.e., above resonance condition) the tuning level circuit 230 may be triggered to decrease the capacitance (C) of the tunable capacitor to increase the resonant frequency. When the resonant frequency is equal to the operating frequency (i.e., at resonance), the tuning level circuit 230 may be triggered to hold the capacitance (C) of the tunable capacitor to hold the resonant frequency. The increase and decrease of the capacitance may proceed in increments so that the effects of each incremental change may be measured by the tuning circuit. In this way, a change in the resonance condition from resonance may be incrementally brought back to resonance over time.

In a possible implementation, of the tuning level circuit is a counter (e.g., digital counter) that can be configured to count-up, count-down, or hold its value based on the output of the phase comparator. In a possible operation scenario, the resonant circuit is at resonance and the counter is holding a value so that the capacitance (C) is fixed. At a first time, the resonant frequency of resonant circuit is reduced (e.g., by external loading). In response, the phase comparator triggers the counter to begins counting down. Each decrease in the count tunes the tunable capacitor to a lower capacitance by an increment based on the tunable capacitor topology. The countdown continues until the phase comparator triggers the counter to hold its new value. The phase comparator may include thresholds so that the counter is not triggered to begin counting up or down until a resonant condition is satisfied. For example, the tuning circuit may be configured to hold the tuning level at a particular level while the phase comparison is within a threshold range around the resonant phase shift.

In a possible implementation the system 600 can further include a latch circuit (i.e., latch 630). The latch may be configured to hold the output of the tuning circuit so that the tuning circuit may be disabled. For example, the latch can be configured to hold the capacitance (C) of the resonant circuit at its current value when the tuning circuit is powered OFF or otherwise disabled. In a possible implementation, the tuning circuit can be enabled or disabled by a enable signal (EN) applied to the tuning circuit 200.

The system 600 can further includes a receive circuit 640 (RX circuit). The system 600 is a transceiver configured to transmit and receive information via NFMI, when the system includes both the transmit circuit 610 and the receive circuit 640. The receive circuit 640 may benefit from tuning. For example, at received signal strength may increase when the resonance condition is met. Accordingly, even when no data transmission is required the transmit circuit may be configured to transmit signals to automatically tune the antenna circuit 300.

Figure 7:
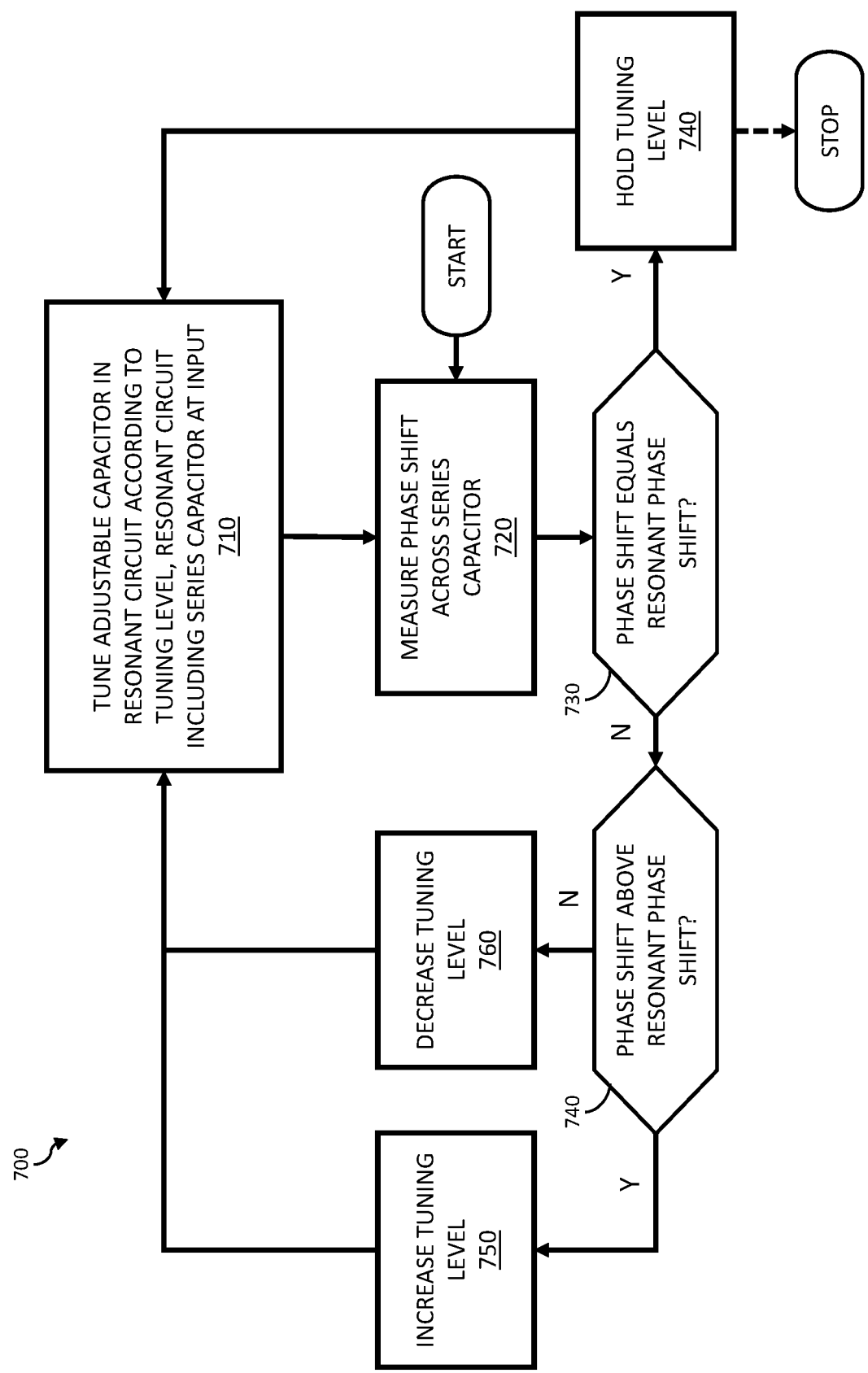
FIG. 7 is a flow chart of a method for tuning a resonant circuit having a series capacitor at an input according to a possible implementation of the present disclosure.

FIG. 7 is a flow chart of a method for tuning a resonant circuit having a series capacitor at an input. The method 700 includes measuring 720 a phase shift across the series capacitor (e.g., positive coupling capacitor (C1) or negative coupling capacitor (C2)) at the input to the resonant circuit. The method further includes checking 730 if the phase shift is at a target phase shift (i.e., resonant phase shift). For example, the resonant phase shift may be ±90 degree phase shift when the resonant circuit is resonating (i.e., at resonance). The phase shift may be considered to be at the resonant phase shift when it is within a range around the resonant phase shift (e.g., ±90 degrees±1 degree). When the phase shift is at the resonant phase shift, then the method 700 includes holding 740 the tuning level. Holding the tuning level may include maintaining a state of an adjustable capacitor.

Figure 8:
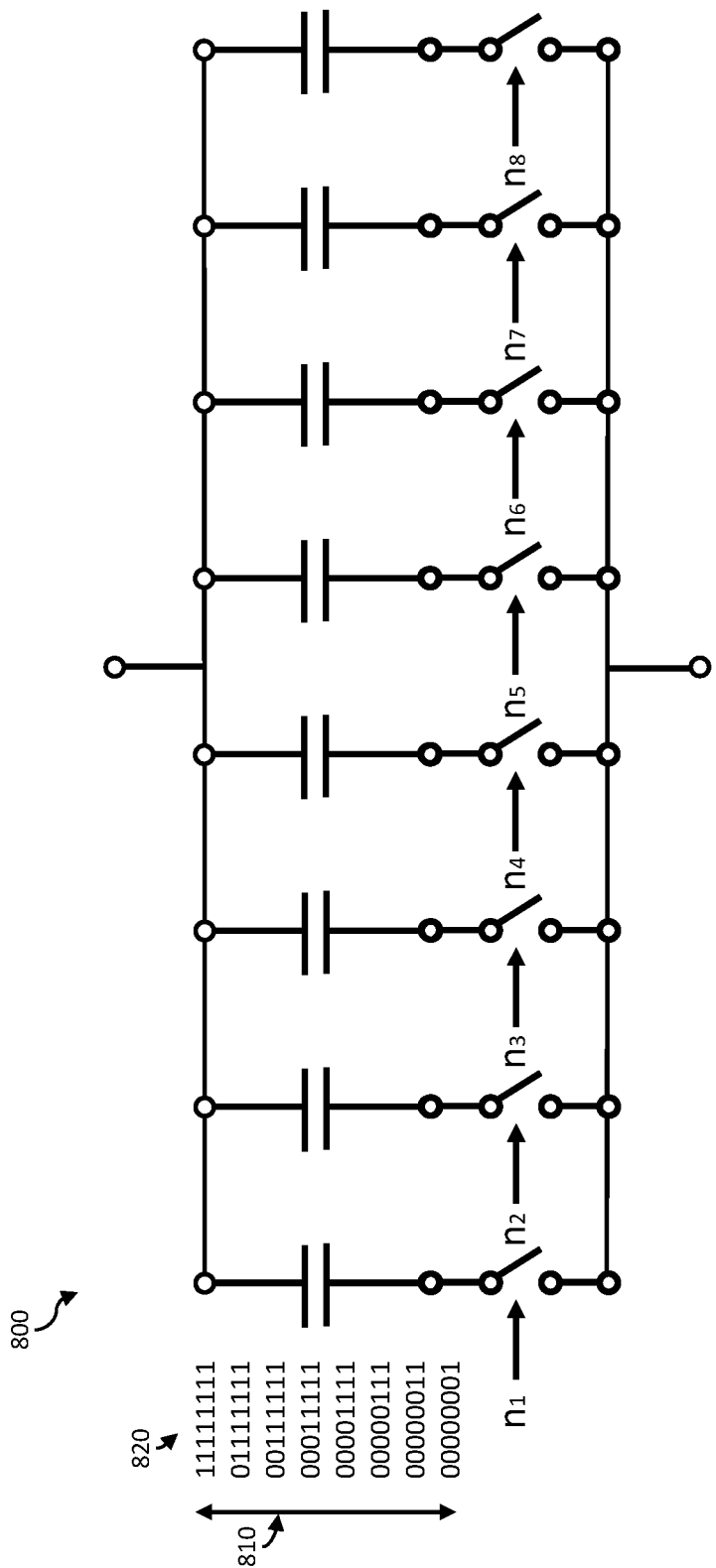
FIG. 8 is a schematic of an adjustable capacitor that can be tuned by a digital count according to an implementation of the present disclosure.

FIG. 8 illustrates an adjustable capacitor according to an implementation of the present disclosure. The adjustable capacitor 800 includes a plurality of capacitors coupled in parallel. Each capacitor includes a switch that is configured to be controlled by a signal. For example, a switch may be closed when the signal is HIGH and may be open when the signal is LOW. In this way, the overall capacitance can be adjusted (i.e., tuned) by controlling the states of the switches. The states of the switches may be controlled by a digital count that is output by the tuning circuit. The digital count 820 may include 8 bits (i.e., $n_1$, $n_2$, $n_3$, $n_4$, $n_5$, $n_6$, $n_7$, $n_8$). Each bit of the digital signal may address one of the switches. A tuning level 810 may correspond to the digital count (i.e., digital word) and the tuning level may be increased or decreased by changing bits in the digital count 820. For example, 00000001 may be a lower tuning level (e.g., the lowest tuning level) and 11111111 may be a higher tuning level (i.e., the highest tuning level). The lower tuning level may correspond to a lower capacitance and the higher tuning level but variation to the particular approach described here are still within the scope of the present disclosure. Increasing or decreasing a tuning level may proceed incrementally. For example, one bit of the digital count (i.e., digital word) may be change at each increment. In a possible implementation, the digital word is generated by a counter that is configured to output a digital signal corresponding to the tuning level. For example, as a counter can increase the tuning level 810 by counting up and decrease the tuning level by counting down.

Returning to FIG. 7, when the phase shift is not at the resonant phase shift, then the method 700 includes checking 740 if the phase shift is above the resonant phase shift (e.g., >±90 degrees). When the phase shift is above the resonant phase shift the resonant circuit may be in the below resonance condition (i.e., Fo<Fr). Accordingly, when the phase shift is above the resonant phase shift, the method 700 includes increasing 750 a tuning level and tuning 710 the adjustable capacitor in the resonance circuit according to the tuning level. For example, increasing the turning level may increase the capacitance of the adjustable capacitor thereby lowering the resonant frequency (Fr) of the resonant circuit.

When the phase shift is not at the resonant phase shift and the phase shift is not above the resonant phase shift (i.e., the phase shift is below the resonant phase shift), the resonant circuit may be in the above resonance condition (i.e., Fr<Fo). Accordingly, when the phase shift is below the resonant phase shift, the method 700 includes decreasing 760 the tuning level and tuning 710 the adjustable capacitor in the resonance circuit according to the tuning level. For example, decreasing the turning level may decrease the capacitance of the adjustable capacitor thereby raising the resonant frequency (Fr) of the resonant circuit.

The method 700 may repeat measuring the phase shift and increasing or decreasing the tuning level unit the phase shift equals the resonant phase shift. When the phase shift equals the resonant phase shift, the resonant circuit may be at resonance. In this condition, the method may hold the tuning level and continue measuring the phase shift across the capacitor. Alternatively, the method may include holding 740 the tuning level and stopping the process. For example, the process may be stopped for a period until triggered. When trigger, the method may resume by measuring 720 the phase shift across the series capacitor to determine the resonant condition, as before.

The disclosed circuits and methods provide tuning based on a phase measurement. and avoids using a reflected signal strength. The tuning circuit may be implemented using digital electronics. which can reduce power consumption and enable the function of the tuning circuit to be disabled and enabled easily.

The use of a magnetic field for communication is suitable for medical and/or body-worn applications because water and air have similar magnetic permeabilities making their boundaries less impactful on the inductive coupling. Despite the similar characteristics, an antenna may be detuned by its environment. Accordingly, tuning the antenna may be necessary in order to maintain an efficiency of the NFMI and provide a reliable NFC. The disclosed circuits and methods facilitate frequent (e.g., continuous) re-tuning as necessary to support changing environments, such as experienced in body worn applications. The body worn applications can include medical devices, such as hearing aids. Further, the tuning can easily accommodate for variations in the system, such as component values and/or operating frequency.

In the specification and/or figures, typical embodiments have been disclosed. The present disclosure is not limited to such exemplary embodiments. The use of the term "and/or" includes any and all combinations of one or more of the associated listed items. The figures are schematic representations and so are not necessarily drawn to scale. Unless otherwise noted, specific terms have been used in a generic and descriptive sense and not for purposes of limitation.

Unless defined otherwise, all technical and scientific terms used herein have the same meaning as commonly understood by one of ordinary skill in the art. Methods and materials similar or equivalent to those described herein can be used in the practice or testing of the present disclosure. As used in the specification, and in the appended claims, the singular forms "a," "an," "the" include plural referents unless the context clearly dictates otherwise. The term "comprising" and variations thereof as used herein is used synonymously with the term "including" and variations thereof and are open, non-limiting terms. The terms "optional" or "optionally" used herein mean that the subsequently described feature, event or circumstance may or may not occur, and that the description includes instances where said feature, event or circumstance occurs and instances where it does not. Ranges may be expressed herein as from "about" one particular value, and/or to "about" another particular value. When such a range is expressed, an aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

It will be understood that, in the foregoing description, when an element is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element, there are no intervening elements present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

The invention claimed is:

1. A system comprising:
    a transmit circuit of a first near-field communication (NFC) device configured to transmit a transmit signal for NFC communication with a second NFC device;
    an antenna circuit configured to generate a magnetic field based on the transmit signal, the antenna circuit including:
        a resonant circuit that includes a coil and an adjustable capacitor; and
        a coupling capacitor connected between the resonant circuit and the transmit circuit; and
    a tuning circuit configured to measure a phase across the coupling capacitor to determine a resonant condition of the resonant circuit without pausing the NFC communication and tune the adjustable capacitor according to the resonant condition.

2. The system according to claim 1, wherein:
    the transmit signal is transmitted at an operating frequency,
    the resonant circuit resonates at a resonant frequency, and
    the resonant condition is determined as a difference between the operating frequency and the resonant frequency.

3. The system according to claim 1, wherein the tuning circuit includes a phase comparator configured to determine a phase difference between the transmit signal and a signal from the coupling capacitor.

4. The system according to claim 3, wherein the tuning circuit further includes a digital counter configured to output a count that is increased or decreased based on the phase difference, the count controlling the adjustable capacitor.

5. The system according to claim 4, wherein the tuning circuit further includes a latch configured to hold the count from the digital counter.

6. The system according to claim 4, wherein:
    a phase difference of +90 degrees corresponds to a resonant condition in which an operating frequency of the signal equals a resonant frequency of the resonant circuit; and
    the digital counter is not increased or decreased in the resonant condition.

7. The system according to claim 3, wherein the coupling capacitor is a positive coupling capacitor connected between a positive input of the antenna circuit and a plus node of the resonant circuit or a negative coupling capacitor connected between a negative input of the antenna circuit and a minus node of the resonant circuit.

8. The system according to claim 7, wherein the tuning circuit includes a phase comparator configured to measure a phase difference between a voltage at the plus node and a voltage of the signal, the phase difference equal to +90 degrees when the resonant circuit is at resonance.

9. The system according to claim 7, wherein the tuning circuit includes a phase comparator configured to measure a phase difference between a voltage at the minus node and a voltage of the transmit signal, the phase difference equal to −90 degrees when the resonant circuit is at resonance.

10. The system according to claim 1, wherein the tuning circuit is configured to measure the phase across the coupling capacitor and tune the adjustable capacitor without a separate tuning process.

11. The system according to claim 1, wherein the phase corresponds to a direction to tune the adjustable capacitor.

12. A system comprising:
a transmit circuit of a first near-field communication (NFC) device configured to transmit a transmit signal for NFC communication with a second NFC device;
a resonant circuit including a coil and an adjustable capacitor;
a coupling capacitor connected between the resonant circuit and the transmit circuit; and
a tuning circuit configured to measure a phase across the coupling capacitor to determine a resonant condition of the resonant circuit without pausing the NFC communication and tune the adjustable capacitor according to the resonant condition.

13. The system according to claim 12, wherein:
the transmit signal is transmitted at an operating frequency,
the resonant circuit resonates at a resonant frequency, and
the resonant condition is determined as a difference between the operating frequency and the resonant frequency.

14. The system according to claim 12, wherein the tuning circuit includes a phase comparator configured to determine a phase difference between the transmit signal and a signal from the coupling capacitor.

15. The system according to claim 14, wherein the tuning circuit further includes a digital counter configured to output a count that is increased or decreased based on the phase difference, the count controlling the adjustable capacitor.

16. The system according to claim 15, wherein the tuning circuit further includes a latch configured to hold the count from the digital counter.

17. The system according to claim 15, wherein:
a phase difference of +90 degrees corresponds to a resonant condition in which an operating frequency of the signal equals a resonant frequency of the resonant circuit; and
the digital counter is not increased or decreased in the resonant condition.

18. The system according to claim 14, wherein:
the resonant circuit and the coupling capacitor are included in an antenna circuit configured to generate a magnetic field based on the transmit signal, and
the coupling capacitor is a positive coupling capacitor connected between a positive input of the antenna circuit and a plus node of the resonant circuit or a negative coupling capacitor connected between a negative input of the antenna circuit and a minus node of the resonant circuit.

19. The system according to claim 18, wherein the tuning circuit includes a phase comparator configured to measure a phase difference between a voltage at the plus node and a voltage of the signal, the phase difference equal to +90 degrees when the resonant circuit is at resonance.

20. The system according to claim 18, wherein the tuning circuit includes a phase comparator configured to measure a phase difference between a voltage at the minus node and a voltage of the transmit signal, the phase difference equal to −90 degrees when the resonant circuit is at resonance.

21. The system according to claim 12, wherein the tuning circuit is configured to measure the phase across the coupling capacitor and tune the adjustable capacitor without a separate tuning process.

22. The system according to claim 12, wherein the phase corresponds to a direction to tune the adjustable capacitor.

23. A system comprising:
a transmit circuit of a first near-field communication (NFC) device configured to transmit a transmit signal at an operating frequency for NFC communication with a second NFC device;
a tunable resonant circuit configured to resonate at a resonant frequency; and
a tuning circuit configured to, without pausing the NFC communication, measure a phase across a coupling capacitor, which couples the tunable resonant circuit and the transmit circuit, to determine a difference between the operating frequency and the resonant frequency as a resonant condition of the tunable resonant circuit.

* * * * *